United States Patent [19]

Fink

[11] Patent Number: 5,652,544
[45] Date of Patent: Jul. 29, 1997

[54] APPARATUS AND METHOD FOR PROGRAMMING AN AMPLIFIER

[75] Inventor: Dennis Fink, Warwick, N.Y.

[73] Assignee: Crest Audio Inc., Paramus, N.J.

[21] Appl. No.: 558,344

[22] Filed: Nov. 16, 1995

Related U.S. Application Data

[63] Continuation of Ser. No. 337,157, Nov. 9, 1994, abandoned.

[51] Int. Cl.$^6$ ........................................................ H03F 1/00
[52] U.S. Cl. ............................ 330/65; 330/129; 330/279; 330/305; 381/88; 381/120
[58] Field of Search ........................ 330/2, 65, 66, 330/129, 279, 305; 381/87, 88, 105, 120, 121

[56] References Cited

U.S. PATENT DOCUMENTS

| | | | |
|---|---|---|---|
| 3,769,606 | 10/1973 | Henegar | 330/66 |
| 3,974,438 | 8/1976 | Alves, III . | |
| 4,000,425 | 12/1976 | Oiwa | 330/66 |
| 4,079,334 | 3/1978 | Hamilton | 330/279 |
| 4,223,272 | 9/1980 | Feistel | 330/51 |
| 4,335,384 | 6/1982 | Roos . | |
| 4,494,212 | 1/1985 | Muellner | 330/278 X |
| 4,510,454 | 4/1985 | Sherman . | |
| 4,547,740 | 10/1985 | Nilsson . | |
| 4,556,841 | 12/1985 | Carlson . | |
| 4,785,419 | 11/1988 | Huffman . | |
| 4,868,516 | 9/1989 | Henderson et al. . | |
| 4,924,192 | 5/1990 | Sasaki | 330/279 |
| 4,987,385 | 1/1991 | Engelmann . | |
| 4,991,221 | 2/1991 | Rush . | |
| 5,006,812 | 4/1991 | Erickson . | |
| 5,015,969 | 5/1991 | Barclay et al. | 330/2 X |
| 5,045,802 | 9/1991 | Miyake et al. | 330/2 |
| 5,059,923 | 10/1991 | Petty et al. . | |
| 5,127,059 | 6/1992 | Elion et al. . | |
| 5,153,528 | 10/1992 | Back | 330/279 X |
| 5,285,500 | 2/1994 | Mantz . | |
| 5,314,524 | 5/1994 | Van Hulle et al. . | |
| 5,339,362 | 8/1994 | Harris . | |

FOREIGN PATENT DOCUMENTS 54-10648  1/1979  Japan .

OTHER PUBLICATIONS

Co-pending Application No. 08/546,839 "Digital Signal Processor for Amplifier" filed Oct. 23, 1995.

*Primary Examiner*—James B. Mullins
*Attorney, Agent, or Firm*—Ostrolenk, Faber, Gerb & Soffen, LLP

[57] ABSTRACT

An apparatus and method for programming an amplifier includes an amplifier and a portable programmer that is removably connectable to the amplifier. The portable programmer includes a microprocessor, a keypad, and a display screen. The amplifier includes a programming input port, a signal processing circuit, a power amplifier and a control circuit. When the portable programmer is connected to the amplifier, information relating to parameter of various signal processing circuit elements can be read and modified through the programmer. The information input via the keypad and displayed on the display screen is transmitted from the programmer via the microprocessor to the signal processing control circuit to change signal processing functions and/or signal process function parameters of at least one of the signal processing circuit elements. As a result, processing of a signal transmitted through the amplifier is changed so that a sound produced by the signal can be modified. The signal processing circuit elements remain programmed when the programmer is removed and/or power is disconnected.

26 Claims, 1 Drawing Sheet

APPARATUS AND METHOD FOR PROGRAMMING AN AMPLIFIER

This is a continuation of application Ser. No. 08/337,157, filed on Nov. 9, 1994 now abandoned.

BACKGROUND OF THE INVENTION

A. Field of the Invention

The present invention relates to an apparatus and method for programming a signal processing circuit of an amplifier, and more particularly, to an amplifier and a portable amplifier programmer capable of being removably connected to the amplifier to read and/or change various parameters of an amplifier signal processing circuit to thereby modify a signal output from the amplifier.

B. Description of the Prior Art

Amplifiers typically have an input port for being connected to an input device such as a musical instrument, a sound system, a public address system, etc. and for receiving audio signals from the input device. The amplifier is also connected to and drives a load or output device such as a loudspeaker. The amplifier includes a signal processing circuit for modifying and amplifying input signals and transmitting the modified signals as output signals to the load.

The signal processing circuits include several resistive elements, capacitive elements, switching elements, operational amplifiers and other suitable devices which are selected to modify an input signal in a desired manner. The various elements of the signal processing circuit define a plurality of sound processing parameters such as a frequency and an amplitude of a cross-over function, relative levels and routing in a mixer, response times, ratios and thresholds in a compressor and frequency, gain and bandwidth in an equalizer.

Thus, when an input signal is transmitted through the various elements of the signal processing circuit, the resultant output signal will have a desired frequency and amplitude in accordance with a signal processing function set in the amplifier.

Users of amplifiers and sound systems often want to modify the signal processing parameters to alter a sound produced by the signals output from the amplifiers. However, it is difficult and time consuming to change the signal processing functions and function parameters in conventional amplifiers for reasons discussed below.

A conventional amplifier 10 is shown in FIG. 3. The amplifier is mounted within an amplifier housing 12 and includes an input port 14 and an output port 16. A load such as a loudspeaker 20 is connected to the output port 16 so that the amplifier 10 drives the loudspeaker 20. A signal processing circuit 30 of the amplifier 10 is located within the amplifier housing 12. The signal processing circuit 30 includes a plurality of signal processing circuit elements which may include a plurality of switches 32, resistors 34 and capacitors 36 and other suitable signal modifying devices (not shown). The signal processing function and function parameters of the amplifier 10 are determined by the plurality of signal processing circuit elements.

The signal processing function and parameters of the amplifier 10 can only be modified by setting one of the switches 32 or removing and/or replacing one or more of the resistors 34 and capacitors 36. However, the amplifier housing 12 must be opened and a signal processing circuit support (not shown) must be removed from the amplifier housing 12 before any of the switches 32, resistors 34 or capacitors 36 can be modified or replaced. After modifying the circuit elements, the signal processing circuit support must be re-inserted into the amplifier housing 12 and the amplifier housing 12 must be closed.

The opening and closing of the amplifier housing 12 and removal of the signal processing circuit support is time consuming and does not allow a user to immediately sound check the results of the modification of the signal processing parameters. Instead, the signal processing circuit support must be reinserted in the amplifier housing 12 to be plugged back into the signal path before the amplifier 10 can be operated. In addition, the modification, removal and/or replacement of the various circuit elements to modify the parameters is a time consuming and difficult process because the signal processing control circuit elements are typically plug-in or solderable components. Also, because anyone is capable of opening the amplifier housing 12 and modifying the signal processing circuit 30, there is no way to prevent an unauthorized modification of the amplifier signal processing parameters.

The conventional amplifier 10 may include a controller 40 for receiving input command signals for modifying the signal processing parameters. The controller 40 can be connected to either manually controllable knobs 50 located on an amplifier control plate (not shown) or to a network 60 comprised of several interconnected amplifiers. If the controller 40 is connected to the knobs 50, any person can make unauthorized modifications to the signal processing parameters by simply turning one of the knobs 50. Also, to repeat the desired settings in a number amplifiers connected in a network, all of the knobs of each of the amplifiers must be individually and manually set to be at the exact same values. If the controller 40 is connected to the network 60, a computer or similar input device must be provided to input control signals through the network 60 to the controller 40 which increases the cost and complexity of the amplifier system.

Also, the presence of the controller 40 in the amplifier 10 introduces noise into the signal path caused by a digital/analog converter required for the controller 40. Further, the amplifier 10 must be provided with a battery backup or other suitable device to provide non-volatility required in digitally controlled systems.

SUMMARY OF THE INVENTION

A preferred embodiment of the present invention provides an amplifier and amplifier programmer capable of being removably connected to the amplifier to quickly and easily change signal processing functions and/or parameters of the amplifier without providing a conventional controller in the amplifier and without modifying signal processing circuit elements. The preferred embodiment of the present invention includes a portable amplifier programmer that is capable of receiving input information and transmitting the input information to an amplifier signal processing circuit to modify signal processing functions and/or parameters.

Another feature of the preferred embodiment relates to an amplifier having a data port for being connected to the portable amplifier programmer and receiving control signals from the programmer. The amplifier also includes a control circuit connected between the data port and a signal processing circuit for performing an interface function between the command signals input from the portable programmer and the signal processing circuit. The control circuit electrically isolates the control elements from the programmer port. It also provides the optional connections required when programming elements over a network.

The control circuit may be preferably located outside of the signal path but connected to the signal processing circuit within the amplifier housing. The control circuit isolates the incoming command signals from the signal processing circuit elements to allow the parameters of the signal processing circuit elements to be modified as desired.

In an alternative embodiment, the control circuit and the signal processing circuit of the amplifier may be formed by a digital signal processor, described in U.S. patent application Ser. No. 08/546,839, which is a continuation application of U.S. patent application Ser. No. 08/336,481, entitled "DIGITAL SIGNAL PROCESSOR FOR AMPLIFIER," filed on Nov. 9, 1994, in the name of the same Applicant as in the present application, the disclosure of which is hereby incorporated by reference. If such a digital signal processor is provided in the amplifier, both signal processing functions and function parameters can be changed by inputting control information from the portable programmer to the amplifier.

The signal processing circuit elements are preferably provided with a memory or storage device for storing a set parameter value so that the set parameter value is not changed or deleted upon an off-on operation of the amplifier. For example, a conventional digitally programmable resistor can be used for one or more of the circuit elements. As is known, such a digitally programmable resistor stores a set resistance to provide a desired non-volatility. In addition, other known storage means such as an on board logic circuit or programmable gate array can be used to store the set parameter values.

The portable amplifier programmer according to the preferred embodiment includes a microprocessor, a keypad, a display screen and a connecting member for connecting the portable amplifier programmer to an amplifier to download signal processing parameters to the amplifier control circuit.

The keypad can be used to input either a desired modification to an output signal or a desired parameter value for a specific signal processing circuit element. An example of the input desired signal modification is a boost of 5 dB in the output signal is desired. The desired signal modification may be preferably displayed on the display screen. The microprocessor receives the desired signal modification and determines which control elements in the signal processing circuit must be modified and to what extent the performance characteristics of the selected control elements must be modified. The microprocessor then generates control signals for modifying the control elements and outputs the control signals to the amplifier to modify the signal processing parameters of the amplifier. More specifically, the control signals are transmitted from the microprocessor through the input port of the amplifier to the control circuit. The control circuit then sends the control signals to the signal processing circuit to modify the signal processing parameters.

When the keypad is used to input a parameter value for one or more of the signal processing circuit elements, the input desired parameter values are received by the microprocessor and converted to a command signal to be downloaded to the control circuit through the portable programmer.

Thus, the microprocessor is programmed to convert the input desired signal modification or desired parameter into a preferably digital command signal for changing the parameters of the amplifier signal processing circuit elements to produce the desired signal modification or desired circuit element parameter value.

If a digital signal processor is provided in the amplifier, programs and program data for defining a plurality of signal processing functions and function parameters may be entered into the portable programmer and downloaded from the portable programmer to the amplifier.

The signal processing circuit may preferably have a memory or storage means for storing the information input from the portable amplifier programmer so that the portable amplifier programmer can be disconnected from the amplifier after inputting the desired signal modification or signal processing function and parameter program.

The programmer is also capable of reading the previously set parameters and functions stored in the signal processing circuit. A portable programmer user can select a reading mode wherein the programmer sends an inquiry signal to the signal processing circuit and outputs to the programmer a set value for each of the signal processing circuit elements. The parameter values for each of the circuit elements may be preferably displayed in numerical form on the programmer display.

The microprocessor in the portable programmer is capable of receiving the previously set parameters of the circuit elements and transfers these parameter values to the display screen to enable a portable programmer operator to decide if a given parameter value should be changed. The keypad can be used to scroll through the parameter values for each of the circuit elements so that each of the parameters for the circuit elements is displayed on the display screen. Because the portable amplifier programmer can read a parameter for each of the circuit elements, the programmer can prompt a portable programmer user to accept or change a parameter for each of the plurality of signal processing circuit elements.

The portable amplifier programmer may preferably include a memory or suitable storage device for storing a plurality of preset signal processing parameters and desired parameter values input through the keypad. The preset signal processing parameters may be stored in a plurality of different groups each of which contains a desired parameter for each of the signal processing circuit elements. For example, if a desired operation of a stereo sound system or public address system varies according to the time of day or the type of event being conducted, the signal processing parameters of an amplifier can be modified by selecting a preset group for that particular time of day or type of event. Thus, the user of the portable amplifier programmer only has to select a single group from a menu and the programmer will input that stored group to the control circuit of the amplifier.

The embodiments of the present invention provide several advantages. Because the programmer can be quickly and easily connected via a data port in the amplifier, there is no need to open the amplifier housing and remove a signal processing circuit support to change the circuit parameters. Also, there is no need to physically modify the circuit elements by setting a switch or removing and/or replacing a capacitor, resistor, operational amplifier or other suitable circuit element. In addition, the amplifier programmer allows changes in the signal processing circuitry of the amplifier to be made while the amplifier is in operation to thereby allow the results achieved by the modification of the signal processing parameters to be evaluated immediately.

Further, because the programmer contains a microprocessor, this eliminates the need for a microprocessor in the amplifier. Accordingly, the complexity and noise produced by a analog/digital converter required with the microprocessor located within the amplifier is eliminated. Also, if a plurality of amplifiers are provided in a network, a substantial savings in amplifier cost is achieved because only one microprocessor is necessary and provided in the portable amplifier programmer instead of a microprocessor being provided in each amplifier.

An improved security feature is provided by the preferred embodiment of the invention. Because the parameters of the signal processing circuit elements cannot be changed without using the portable amplifier programmer, no unauthorized modification of the signal processing circuit elements is possible.

Further, non-volatility is achieved without battery backup, RAM or ROM so that when the control signals for the signal processing circuit elements in the amplifier are input from the programmer, the circuit elements remain programmed whether the power to the amplifier is on or off. In addition, the amplifier circuitry can be programmed by either the portable programmer or a standard computer which is connected to a network of amplifiers which allows for maximum flexibility.

Also, the programmer can easily download the same parameter settings via the network to a number of amplifiers ensuring identical setup. This eliminates the need to independently and manually change the knobs on each of a plurality of amplifiers.

Other features and advantages of the present invention will become apparent from the following description of the invention which refers to the accompanying drawings.

DETAILED DESCRIPTION OF A PREFERRED EMBODIMENT

Figure 1:
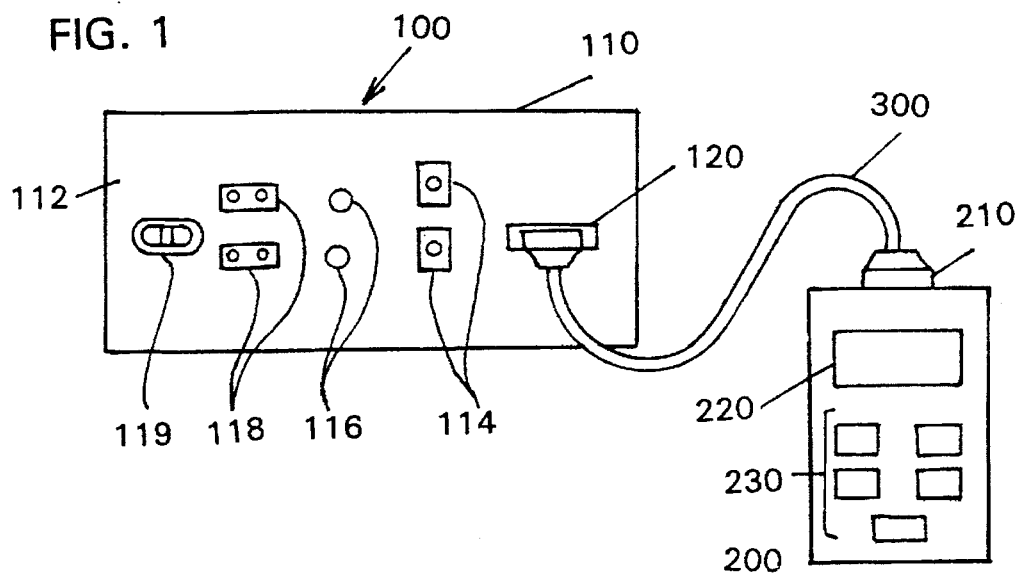
FIG. 1 is a schematic view showing a preferred embodiment of a portable amplifier programmer and amplifier of the present invention.

An amplifier 100 according to one aspect of a preferred embodiment of the invention is shown in FIG. 1. The amplifier includes an amplifier housing 110 which includes a control panel 112 having a plurality of control elements and ports. Input ports 114 for receiving connectors from one or more input devices are provided on the control panel 112. Also, a plurality of control knobs 116 for controlling gain, volume, an equalizer circuit, a level threshold, etc. are provided on the control panel 112 as is conventional. A plurality of output ports 118 and an AC power connector 119 are also provided on the control panel 112.

The control panel 112 also includes a programming port 120 for receiving a connector from the portable amplifier programmer described below. This programming port may also be connected to a data bus of a network of interconnected amplifiers. The network is connected to a computer or other similar device and control information can be input from the computer to the amplifier via the programming port 120.

A preferred embodiment of a portable amplifier programmer 200 is also shown in FIG. 1. The programmer 200 is removably connectable to the amplifier 100 through a connector 300 which is connected to the programming port 120 of the amplifier 100 and an output port 210 of the portable programmer 200. The programmer 200 preferably includes a display screen 220 for displaying parameter values, desired signal modifications and other suitable information. The portable programmer 200 also includes an input device such as keypad 230 for entering parameter and signal modification information, signal processing function programs and program data.

The portable programmer 200 allows a user to modify parameters of amplifier circuit elements inside the amplifier, modify signal processing functions set by the signal processing circuit, read back previously set parameter values and store a group of input parameter values for future use as will be explained in greater detail below.

Figure 2:
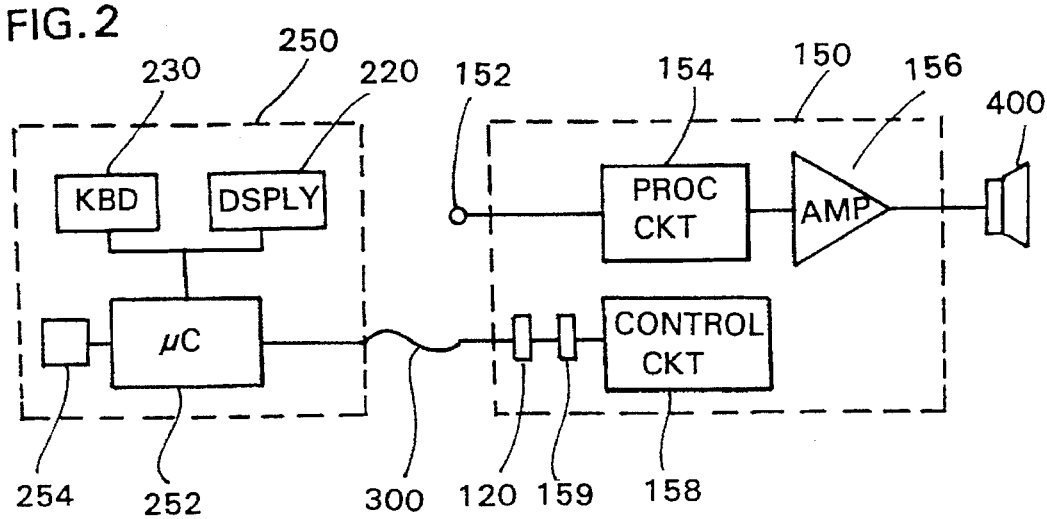
FIG. 2 is a schematic view of the control circuit of the programmer and amplifier shown in FIG. 1.
Figure 3:
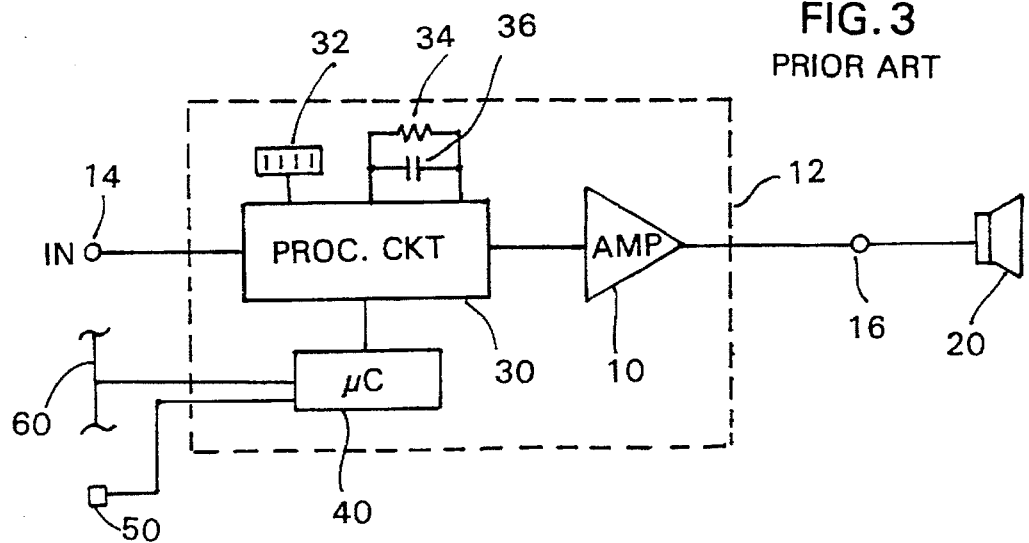
FIG. 3 is a schematic view of a conventional amplifier circuit having a conventional signal processing parameter programmer.

FIG. 2 shows an amplifier circuit 150 of the amplifier 100 shown in FIG. 1 and an operational circuit 250 of the portable programmer 200.

The amplifier circuit 150 of the amplifier 100 includes an input interface 152 connected to the input port 116. The input interface 152 provides audio signals from an input device (not shown) such as a musical instrument, public address system, sound system, etc. to a signal processing circuit 154 which is connected to a power amplifier 156. The amplifier circuit 150 is connected to a load 400 such as a loudspeaker.

The signal processing circuit 154 and power amplifier 156 are preferably located within the amplifier housing 110. The amplifier housing 110 also has a control circuit 158 located therein. The control circuit is preferably connected to the programming port 120 and the signal processing circuit 154.

The amplifier circuit 150 may be provided with a memory or storage device 159 for storing input command signals therein. As soon as the command signals have been input from the programmer 200 through the connector 300 to the programming port 120, the programmer 200 can be disconnected from the amplifier 100 because the input commands are stored in the storage device 159. Alternatively, the storage device can be provided in the signal processing circuit 154.

Programming information is input from the portable programmer 200 through the connector 300 and the programming port 120 to the control circuit 158. This programming information may comprise signal processing function programs and program data for defining function parameters, parameter modification requests, new parameters, and other suitable control information.

The control circuit 158 preferably comprises a programmable microprocessor for performing an interface function between the command signals input from the portable programmer 200 and the signal processing circuit 154. In an alternative embodiment, the control circuit and the signal processing circuit of the amplifier may be formed by a digital signal processor, described in U.S. patent application Ser. No. 08/336,481 mentioned above. If such a digital signal processor is provided in the amplifier 100, both signal processing functions and function parameters can be changed by inputting control information from the portable programmer 200 to the amplifier 100.

The elements of the signal processing circuit 154 are preferably provided with a memory or storage device for storing a set parameter value so that the set parameter value is not changed or deleted upon an off-on operation of the amplifier. For example, a conventional digitally programmable resistor can be used for one or more of the circuit elements. As is known, such a digitally programmable resistor stores a set resistance to provide a desired non-volatility. In addition, other known storage means such as an on board logic circuit or programmable gate array can be used to store the set parameter values.

In the programmer circuit 250, a microprocessor 252 is provided and has an output end connected to the connector 300. The keypad 230 and display 220 are connected to an input end of the microprocessor 252. A memory or storage device 254 may be provided in the portable programming circuit. The microprocessor 252 receives information from the keypad 230 and may store the input information in the memory 254. The memory may also store previously set parameter values, a menu and plurality of groups of parameter values, signal processing function programs and program data and other suitable control information. The microprocessor 252 also controls the display screen 220 to display parameter values and various read and input information.

The operation of the preferred embodiment of the invention will be described in the following paragraphs. At least one audio signal input device such as those described above is connected to the input port 114 of the amplifier 100. At least one output device or load such as a loudspeaker 400 is connected to the output port 118.

A programming operation can be conducted while the amplifier is powered through the AC adapter 119 and functioning or while the amplifier 100 is not operating and receiving power. However, it is preferable to perform the amplifier programming operation while the amplifier 100 is receiving and outputting signals to hear the effects of parameter modifications.

The connector 300 is inserted into the programming port 120 of the amplifier 100 to connect the portable programmer 200 to the amplifier 100. A user can select a diagnostic mode by activating an appropriate key on the keypad 230. In the diagnostic mode, a parameter value for each of the signal processing circuit elements is read by the microprocessor 252 and displayed on the display 220 for operator verification. The microprocessor 252 converts the read data to a numerical value so that each parameter is displayed numerically.

The microprocessor 252 may preferably be programmed to request that a user confirm a read parameter value or change the parameter to a desired value by using an appropriate key on the keypad 230.

The information input via the keypad 230 is converted to control signals by the microprocessor 252. These control signals are preferably digital control signals for modifying the control elements of the signal processing circuit 154.

Once all of the signal processing function programs and/or function parameter values have been input to the programmer 200 and the microprocessor 252 has converted the input control information to control signals, the user can actuate a send key on the keypad 230 to transmit the new signal processing function and/or parameter information to input port 120 of the amplifier.

If a storage device 159 is provided, the input command signals are stored in 159 which allows the programmer 200 to be immediately removed after transmission of the command signals.

The control signals are transmitted from the input port 120 or storage device 159 to the control circuit 158. The control circuit 158 then sends control signals to the signal processing circuit to modify the performance characteristics of various control elements of the signal processing circuit 154 to achieve a desired modification of a signal processing function and/or function parameters.

As discussed above, the signal processing circuit elements are preferably provided with storage means for storing the set parameters to maintain the set parameters despite power up and power down of the amplifier 100.

If the user dislikes the sound produced by the modification of the signal processing function and/or function parameters, the user can modify any one or all of the parameters of the signal processing circuit elements by either individually changing each parameter or selecting the previously set groups of parameter values which are stored in the memory 254. Preferably, the user can select a menu mode in which the programmer displays on the display screen 220 a menu of various groups of previously set parameters. The user can then select one of the groups by actuating an appropriate key on the keypad 230. Then, the stored group of parameter values is input to the amplifier as described above.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An amplifier comprising:
   an input port for receiving an input signal;
   a signal processing circuit comprising a digital signal processor capable of receiving at least one of a signal processing function and a signal processing function parameter, wherein the signal processing circuit receives the input signal from the input port and modifies the input signal;
   a power amplifier for amplifying the modified input signal received from the signal processing circuit and outputting an amplified signal to an output device;
   an external programmer; and
   a programming signal input port for receiving at least one programming signal from the external programmer, the external programmer being removably connectable to the programming signal input port for modifying at least one of a signal processing function and a signal processing function parameter defined in said signal processing circuit.

2. The amplifier of claim 1, further comprising a control circuit for receiving the programming signal and converting the programming signal to a control signal to be sent to the signal processing circuit for modifying at least one of the signal processing function and the signal processing function parameter defined in said signal processing circuit.

3. The amplifier of claim 2, wherein the signal processing circuit comprises a storage device for storing at least one of the signal processing function and the signal processing function parameter produced by the control circuit.

4. The amplifier of claim 2, wherein the control circuit comprises a programmable microprocessor.

5. The amplifier of claim 1, further comprising a storage device for storing said at least one programming signal.

6. The amplifier of claim 1, further comprising an amplifier housing, the signal processing circuit and power amplifier being located in said amplifier housing.

7. The amplifier of claim 1, further comprising a control panel, wherein said programming signal input port is provided on the control panel.

8. The amplifier of claim 1, wherein the signal processing circuit further comprises a plurality of electronic components and a non-volatile storage means for storing a set performance characteristics.

9. The amplifier of claim 1, wherein the external programmer comprises:

an input/output port for sending and receiving control information;

a data input device for allowing input of programming information to the programmer; and a controller for receiving the input programming information, generating programming signals from the input programming information and transmitting the programming signals through the input/output port to the amplifier for modifying at least one of a signal processing function and a signal processing function parameter of the amplifier.

10. The amplifier of claim 9, wherein the external programmer further comprises a display screen for displaying input programming information and information read by the controller.

11. The amplifier of claim 9, wherein the external programmer further comprises a storage device for storing the input programming information and previously selected control signals.

12. The amplifier of claim 9, wherein the data input device comprises a keypad having a plurality of keys.

13. The amplifier of claim 9, wherein the controller comprises a microprocessor for receiving programming information from at least one of the input device and a control circuit of the amplifier.

14. The amplifier of claim 9, wherein the controller comprises a connector for removably connecting the programmer to the amplifier.

15. The amplifier programmer of claim 9, wherein said programmer a standard computer.

16. The amplifier programmer of claim 9, wherein said programmer stores in groups said at least one of a signal processing function and a signal processing function parameter according to the time of day during which said amplifier is to operate.

17. The amplifier programmer of claim 9, wherein said programmer stores in groups said at least one of a signal processing function and a signal processing function parameter according to the type of event for which said amplifier is to operate.

18. The amplifier of claim 1, wherein said amplifier executes operation according to said at least one of a signal processing function and a signal processing function parameter after said external programmer is disconnected from said amplifier.

19. The amplifier of claim 1, wherein said external programmer is a standard computer.

20. The amplifier of claim 1, wherein said digital signal processor receives and stores at least one of a signal processing function and a signal processing function parameter for a crossover function.

21. The amplifier of claim 1, wherein said digital signal processor receives and stores a combination of at least two signal processing functions.

22. The amplifier of claim 1, wherein said digital signal processor receives and stores at least one of a signal processing function and a signal processing function parameter which automatically vary the operation of said amplifier according to the time of day.

23. The amplifier of claim 1, wherein said digital signal processor receives and stores at least one of a signal processing function and a signal processing function parameter for a volume control function.

24. The amplifier of claim 1, wherein said digital signal processor receives and stores at least one of a signal processing function and a signal processing function parameter for an equalizing function.

25. The amplifier of claim 1, wherein said digital signal processor receives and stores at least one of a signal processing function and a signal processing function parameter for a compression function.

26. The amplifier of claim 1, wherein said digital signal processor receives and stores at least one of a signal processing function and a signal processing function parameter for a level threshold function.

* * * * *